United States Patent [19]

Nishino et al.

[11] Patent Number: 5,272,358
[45] Date of Patent: Dec. 21, 1993

[54] SUPERCONDUCTING DEVICE

[75] Inventors: Toshikazu Nishino, Kawasaki; Ushio Kawabe, Tokyo; Mutsuko Hatano, Kodaira, all of Japan

[73] Assignee: Hitachi, Ltd., Tokyo, Japan

[21] Appl. No.: 796,885

[22] Filed: Nov. 25, 1991

Related U.S. Application Data

[63] Continuation of Ser. No. 501,308, Mar. 26, 1990, abandoned, which is a continuation of Ser. No. 84,075, Aug. 11, 1987, abandoned.

[30] Foreign Application Priority Data

| Aug. 13, 1986 [JP] | Japan | 61-188449 |
| Aug. 13, 1986 [JP] | Japan | 61-188451 |
| Aug. 15, 1986 [JP] | Japan | 61-190520 |

[51] Int. Cl.⁵ .................................................. H01L 39/22
[52] U.S. Cl. ........................................ 257/36; 257/34; 257/38; 257/39
[58] Field of Search ............ 357/4, 16, 5, 22 A, 357/30 B, 30 E, 30 I, 30 J, 30 L, 30 R, 65, 22 D; 257/31, 34, 36, 37, 38, 39

[56] References Cited

U.S. PATENT DOCUMENTS

| 3,348,074 | 10/1967 | Diemer | 357/30 I X |
| 3,702,956 | 11/1972 | Renard et al. | 357/5 |
| 4,028,714 | 6/1977 | Henkels | 357/5 |
| 4,377,030 | 3/1983 | Pettenpaul et al. | 357/22 I |
| 4,395,813 | 8/1983 | Roth et al. | 357/5 |
| 4,407,004 | 9/1983 | Yeh | 357/22 I |
| 4,424,525 | 1/1984 | Mimura | 357/16 |
| 4,589,001 | 5/1986 | Sakai et al. | 357/5 |
| 4,647,954 | 3/1987 | Graf et al. | 357/23.3 |
| 4,675,711 | 6/1987 | Harder et al. | 357/5 X |
| 4,884,111 | 11/1989 | Nishino et al. | 357/65 X |
| 4,888,629 | 12/1989 | Harada et al. | 357/22 D X |

FOREIGN PATENT DOCUMENTS

| 0181191 | 5/1986 | European Pat. Off. . | |
| 106186 | 7/1982 | Japan | 357/5 |
| 239681 | 10/1986 | Japan | 357/5 |

OTHER PUBLICATIONS

Sze, S. M., *Physics of Semiconductor Devices*, John Wiley, 1981, pp. 433–438.
*Journal of Applied Physics*, vol. 51, No. 5, May 1980, pp. 2736–2743, T. D. Clark et al, "Feasibility of hybrid Josephson field effect transistors".
*Patent Abstracts of Japan*, vol. 7, No. 17 (E-154) [1162], Jan. 22, 1983; relating to JP-A-57 176 781 (Tokyo Shibaura Denki K.K.).
*IEEE Electron Device Letters*, vol. EDL-6, No. 6, Jun. 1985, pp. 297–299, T. Nishino et al, "Three-terminal superconducting device using a Si single-crystal film".

*Primary Examiner*—Sara W. Crane
*Attorney, Agent, or Firm*—Antonelli, Terry, Stout & Kraus

[57] ABSTRACT

In a superconducting device wherein the value of a superconducting current to flow between two superconducting electrodes provided in contact with a semiconductor is controlled by a control electrode provided between the superconducting electrodes, high impurity concentration regions are formed within the semiconductor so as to lie in contact with the superconducting electrodes and to extend to under ends of the control electrode.

47 Claims, 5 Drawing Sheets

SUPERCONDUCTING DEVICE

This application is a continuation of application Ser. No. 07/501,308, filed on Mar. 26, 1990 abandoned which is a continuation of Ser. No. 07/084,075, filed Aug. 11, 1987 now aband.

BACKGROUND OF THE INVENTION

1. Field of the Invention

The present invention relates to a superconducting device which utilizes a superconductor adapted to fall into a superconducting state at a predetermined temperature, and more particularly to a superconducting device which can operate as a transistor.

2. Description of the Related Art

As a switching device which utilizes a superconductor, the Josephson device has heretofore been known. When compared with conventional semiconductor transistors, the Josephson device has the merits of a higher switching speed and a lower power consumption (several $\mu W$). However, this Josephson device is basically a two-terminal device. It has consequently been impossible to exploit circuit techniques accumulated with the conventional semiconductor transistors, for the circuit arrangement of the Josephson device. Another drawback has been that the Josephson device must use an A.C. power source.

As a solution to these drawbacks, a superconducting device in which a superconductor and a semiconductor are combined is disclosed in the official gazette of Japanese Patent Application Laid-open No. 106186/1982. This superconducting device is constructed of a pair of superconductor layers which are disposed on a semiconductor substrate, and a control electrode which is disposed through an insulator layer in a part where the end faces of the superconductor layers oppose to each other. In this prior-art example, the superconducting device is fabricated in such a way that a superconductor layer formed on the semiconductor substrate is separated into two portions by photolithography and etching, to form the pair of superconductor electrodes, and that the separating part is thermally oxidized to form the insulator film, on which the control electrode is formed by evaporation.

In addition, a superconducting transistor (JOFET: Josephson Field Effect Transistor), the operating principle of which is such that the value of a superconducting current flowing across two superconductor electrodes disposed in contact with a semiconductor is controlled by changing a superconducting proximity effect with a voltage applied to a control electrode, is discussed in "Journal of Applied Physics," Vol. 51 (1980), p. 2786 by T. D. Clark.

The above technique is intended to realize a superconducting device of the field effect type. In fabricating the superconducting transistor of this type, a pair of superconductor electrodes confronted at a fixed distance l are disposed on a semiconductor substrate, and a control electrode is disposed in the confronting part. The value of the distance l is selected at about 5-10 times a coherence length $\xi_n$ in the semiconductor. When the value l is smaller than this range, the coupling between the superconductor electrodes is too intense, and the control by the control electrode becomes difficult, to incur by way of example the problem that the gain of the superconducting transistor lowers. In the superconducting transistor, accordingly, the opposing parts of the two superconductor electrodes cannot be brought closer than the certain value determined by the material of each semiconductor, from the viewpoint of the characteristics of the transistor. Meanwhile, the gate capacitance of a field effect transistor depends upon the length of a channel. In the superconducting transistor of the prior art, the distance between the two superconductor electrodes is substantially equal to the length of a channel. With the prior art, accordingly, the gate capacitance of the superconducting transistor cannot be rendered less than a fixed value, and this has led to the problem that the operating speed of the superconducting transistor closely related to the gate capacitance cannot be expected to rise.

Besides, the following literatures on superconducting devices have been known:

A) IEEE Trans. Magn., vol. MAG-15, pp. 435-438, 1979

B) IEEE Trans. Electron Devices, vol. ED-28, pp. 1394-1397, 1981

C) Official Gazette of Japanese Patent Application Laid-open No. 176781/1982

The aforementioned JOFET published by T. D. Clark includes electrodes made of a superconductor on a heavily-doped semiconductor substrate, and has its device characteristics controlled by a control electrode disposed on the semiconductor substrate through an insulator layer. $Si_3N_4$, $SiO_2$ or the like formed by CVD is employed as the insulator layer for electrically isolating the control electrode from the pair of superconducting electrodes.

Since the prior art forms a gate insulator layer and an inter-layer insulator film by the use of a method of evaporating $SiO_2$, $Si_3N_4$ or the like, the thickness of the gate insulator layer becomes unnecessarily great. Therefore, a voltage in excess of several volts must be applied for controlling the characteristics. This has led to the disadvantage of the prior art that a circuit gain exceeding unity cannot be achieved.

Moreover, in the fabrication of the superconducting electrodes, the deposited inter-layer insulator film and the superconducting electrodes need to be simultaneously fabricated. Therefore, the prior art has had the problem that the total thickness of the materials of the parts to be processed becomes very great and that a satisfactory fabrication precision is difficult to be attained.

SUMMARY OF THE INVENTION

The first object of the present invention is to provide the structure and materials of a superconducting device which makes it possible to reduce a substantial channel length while ensuring a sufficient gain, thereby to decrease a gate capacitance and to raise a switching speed.

The second object of the present invention is to provide a superconducting device which is well suited to heighten a gain and to stabilize an operation.

The third object of the present invention is to provide a superconducting device of high gain, high speed and low power consumption which is suited for integration requiring no microfabrication technique.

The superconducting device of the present invention comprises, at least:

a semiconductor body;

a pair of superconducting electrodes formed in contact with said semiconductor body;

impurity regions formed within said semiconductor body, which are individually in contact with the corresponding ones of said pair of superconducting electrodes, and means to control current flowing across said pair of superconducting electrodes, the current controlling means being formed on said semiconductor body.

Important in the superconducting device of the present invention is that the effective width of the current controlling means is made smaller than the distance between the superconducting electrodes.

Here, the "effective width of the current controlling means" is intended to signify a width which, in effect, controls the superconducting weak-coupling state between the pair of superconducting electrodes. Accordingly, in a case where the current controlling means is constructed of a stacked structure consisting of an insulator layer and an electric conductor layer, the width of the electric conductor layer is the effective width.

By making the effective width of the current controlling means smaller than the distance between the superconducting electrodes, a capacitance (denoted by $C_{GD}$) which appears between the current controlling means and the impurity region within the semiconductor body, functioning as means to transfer current, can be sharply reduced. Accordingly, a device of high speed operation can be realized.

Further, in the superconducting device of the present invention, the pair of impurity regions within the semiconductor body should preferably be extended to the inner sides of the effective width of the current controlling means. This aspect of performance is important especially for a high speed operation. Of course, each impurity region may well have its end face registered with the corresponding end of the effective width of the current control means without being extended inwardly of the effective width.

More preferably, the current controlling means is arranged so as to cover parts of the respective impurity regions formed within the semiconductor body. Such an arrangement is more useful for a high operating speed.

Besides, the depth of the impurity regions within the semiconductor body is set at or above 0.5 $\xi$ (a coherence length), preferably at or above $\xi$. This is required, not only for establishing the electric contact between each impurity region and the corresponding superconducting electrode, but also for establishing a favorable superconducting coupling between the two superconducting electrodes.

In the operation of a superconducting transistor, an accumulation layer or inversion layer within a semiconductor in the area between two opposed superconducting electrodes is controlled, thereby to control the characteristics of the device. Herein, a field effect need not be induced over the whole opposing area. Even if the width of a control electrode is smaller than the spacing of the superconducting electrodes, superconducting electron pairs in a superconductor can readily diffuse into the parts of the semiconductor vicinal to the ends of the control electrode in the presence of impurity regions which are formed in contact with the superconducting electrodes and extended therefrom to the vicinities of the ends of the control electrode within the semiconductor. If a semiconductor region under the control electrode has an impurity concentration lower than that of the aforementioned impurity regions or a conductivity type opposite to that of the impurity regions, any superconducting coupling is not established between the two superconducting electrodes of the superconducting transistor under the condition in which no voltage signal is applied to the control electrode. However, under the condition in which a voltage is applied to the control electrode, the accumulation layer or inversion layer is formed in the part of the semiconductor underlying the control electrode. Thus, the superconducting electron pairs having diffused to the parts near the ends of the control electrode can be further diffused from both the side parts to the part under the control electrode with ease, and a superconducting coupling is induced between the two superconducting electrodes, so that a superconducting current flows.

In this way, according to the present invention, the effective channel length is reduced without shortening the distance l between the superconducting electrodes of the superconducting transistor, whereby the superconducting transistor which exhibits a high operating speed while holding a high gain can be realized.

These and other objects and many of the attendant advantages of this invention will be readily appreciated as the same becomes better understood by reference to the following detailed description when considered in connection with the accompanying drawings.

DESCRIPTION OF THE PREFERRED EMBODIMENTS

Embodiment 1

Figure 1:
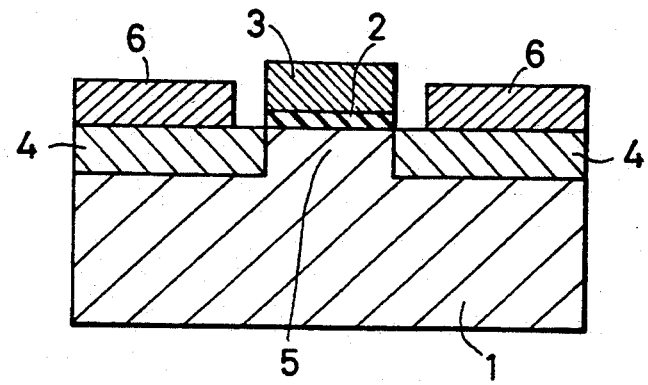
FIG. 1 is a sectional view showing a part of the first embodiment of the present invention.

The first embodiment of the present invention will be described with reference to FIG. 1. On a semiconductor substrate 1 made of a p-type GaAs single-crystal, an evaporated thin film of SiO having a thickness of 20-100 nm is formed. An Mo thin film 200 nm thick is further deposited on the SiO evaporated thin film by r.f. sputtering. Thereafter, a resist pattern having a width of 0.2 $\mu$m is formed by the use of an electron-beam resist and electron-beam lithography, and using the resist pattern as a mask, a gate insulator film 2 and a control electrode 3 are fabricated by reactive ion etching which employs $CF_4$ gas.

Subsequently, using the double-layer film composed of the gate insulator film 2 and the control electrode 3 as a mask, Si ions are introduced into the semiconductor substrate 1 by ion implantation, to form high impurity concentration layers 4 which have an impurity concentration of at least $1 \times 10^{18}$ cm$^{-3}$ and which are then treated for activation. Since, in this case, the high impurity concentration layers 4 are formed in self-aligned fashion, the inner ends thereof reach the parts of the semiconductor substrate 1 just under the end faces of the control electrode 3.

The surface of the semiconductor substrate 1, especially the surfaces of the high impurity concentration layers 4, is subjected to a cleaning treatment so as to remove the dirt and oxides of the surface. Thereafter, Nb is deposited to a thickness of 100 nm by d.c. magnetron sputter deposition, whereupon using a pattern of photoresist as a mask, two superconducting electrodes 6 are formed by reactive plasma etching based on $CF_4$ gas.

In an example, the width of each superconducting electrode 6 was 20 μm, but this value is not restrictive. The distance of the opposing parts of the superconducting electrodes 6 was set at 0.5 μm. This value is not restrictive, either. In order to heighten the gain of a superconducting transistor, however, it is generally desirable that the distance lies in a range of 5-20 times a superconducting coherence length $\xi_n$ within the semiconductor. The reason is that, when the distance is less than 5 times the superconducting coherence length $\xi_n$, the control of characteristics by the control electrode 3 becomes difficult, whereas when the distance is greater than 20 times, a superconducting current which can be obtained becomes lower in level than thermal noise. In the present embodiment, the dimension of the control electrode 3 in the direction of a channel portion 5 is 0.2 μm. That is, the dimension of the control electrode 3 is smaller than the distance of the opposing parts of the superconducting electrodes 6. This relation is also apparent from FIG. 1. In a case where the control electrode 3 and the gate insulator film 2 have their ends held in contact in this manner, the superconducting electrodes 6 are, in general, difficult of efficiently extracting a superconducting wavefunction because a field effect does not extend to parts just under the superconducting electrodes 6. In contrast, with the structure of the present invention wherein the high impurity concentration layers 4 are extended to the positions just under the ends of the control electrode 3 while being in contact with the superconducting electrodes 6, the control of the wavefunction from the superconducting electrodes 6 can be efficiently realized even when the width of the control electrode 3 is made smaller. Thus, while the gain of the superconducting transistor is raised, the gate dimension is decreased, so that a high-speed switching operation can be actualized. In the present embodiment, GaAs is employed as the material of the semiconductor substrate 1, but needless to say, it may well be replaced with any of Si, Ge, InAs, InP, InSb, GaSb, etc. It is also allowed to render the conductivity types of the semiconductor portions opposite.

Embodiment 2

Figure 2:
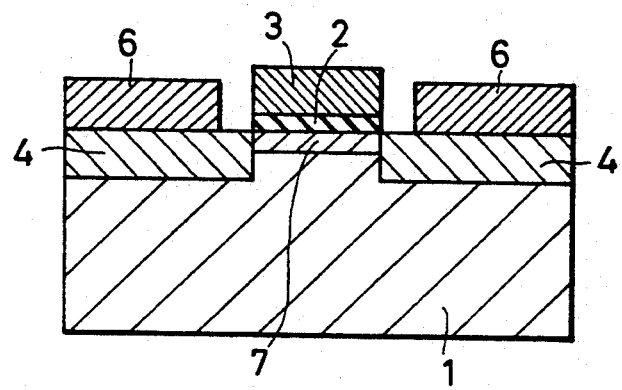
FIG. 2 is a sectional view showing a part of the second embodiment of the present invention.

Now, the second embodiment of the present invention will be described with reference to FIG. 2. In the present embodiment, besides the structure of the first embodiment, an impurity-doped portion 7 is formed by introducing an impurity into the channel portion of the semiconductor just under the control electrode 3 beforehand.

In order to realize this structure, the impurity may be introduced into the surface of the semiconductor substrate 1 at the beginning of a process. This measure makes it possible to adjust the threshold voltage of the superconducting transistor, or to manufacture the superconducting transistor in either of the enhancement mode and depletion mode. It is accordingly needless to say that, in forming a circuit arrangement, the superconducting transistors having the structure of the present embodiment need not always be exclusively employed, but may well be combined with, for example, the superconducting transistors having the structure shown in the first embodiment or/and ones to be taught by the following embodiments.

Embodiment 3

Figure 3:
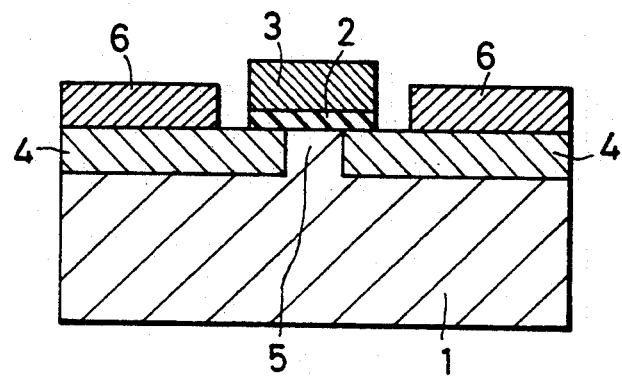
FIG. 3 is a sectional view showing a part of the third embodiment of the present invention.

FIG. 3 shows a part of a superconducting transistor according to the third embodiment of the present invention. This embodiment adopts a structure in which high impurity concentration layers 4 extend inwards to under a control electrode 3. Also with such a structure, the objects of the present invention can be accomplished. In this case, even when only one of the two high impurity concentration layers 4 gets under the control electrode 3, the objects of the present invention can be achieved similarly to the present embodiment.

Embodiment 4

Figure 4:
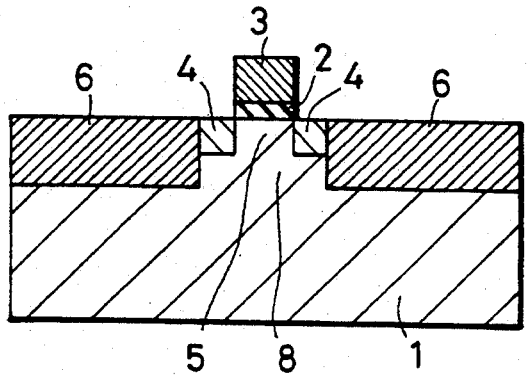
FIG. 4 is a sectional view showing a part of the fourth embodiment of the present invention.

Referring now to FIG. 4, the fourth embodiment of the present invention will be described. An evaporated film made of SiO and having a thickness of 20-100 nm is formed on a semiconductor substrate 1 which is made of a p-type GaAs single crystal. Subsequently, an Mo thin film 200 nm thick is deposited by r.f. sputtering, and a pattern of electron-beam resist having a width of 0.2 um is formed by the use of the electron-beam resist and electron-beam lithography. Using the pattern as a mask, reactive ion etching with $CF_4$ gas is carried out to form a gate insulator film 2 and a control electrode 3. At the next step, using the double-layer film composed of the gate insulator film 2 and the control electrode 3 as a mask, Si ions are introduced into the semiconductor substrate 1 by ion implantation so as to form high impurity concentration layers 4. Subsequently, using a pattern of photoresist as a mask, the surface of the semiconductor substrate 1 is etched so that a projection 8 including a channel portion 5 and parts of the high impurity concentration portions 4 may be left behind. Subsequently, the surface of the semiconductor substrate 1 exposed by the etching is cleaned. Thereafter, Nb is deposited to a thickness of 100 nm by electron-beam evaporation and is fabricated into superconducting electrodes 6 by the lift-off method in which the photoresist is removed. In an example, the distance between the superconducting electrodes 6 was set at 0.5 μm as stated before. Also in this case, the inner ends of the high impurity concentration layers 4 may register with the end faces of the control electrode 3 or extend to under this control electrode. These points are the same as in the foregoing embodiments. In addition, the high impurity concentration layers 4 are as deep as the superconducting electrodes 6 or are shallower than the lower ends of the superconducting electrodes 6.

Embodiment 5

Figure 5:
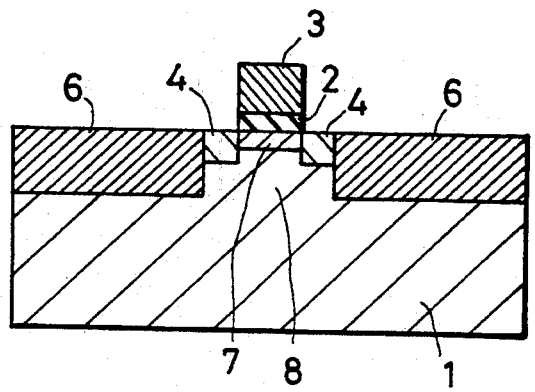
FIG. 5 is a sectional view showing a part of the fifth embodiment of the present invention.

Next, the fifth embodiment of the present invention will be described with reference to FIG. 5. A superconducting transistor shown in FIG. 5 is such that an impurity is previously introduced into the channel portion 5 of the superconducting transistor of the structure disclosed as the fourth embodiment, so as to form an impurity-doped portion 7. Although the conductivity type of the impurity-doped portion 7 is opposite to that of the high impurity concentration layers 4 here, this is not restrictive. Owing to the impurity-doped portion 7, the threshold voltage of the superconducting transistor can be adjusted, and the superconducting transistor of either of the enhancement and depletion modes can be optionally realized.

Embodiment 6

Figure 6:
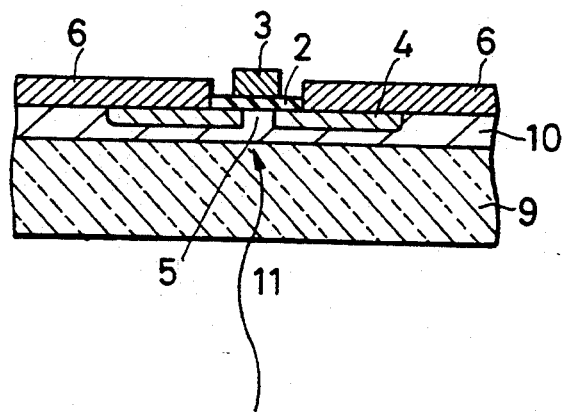
FIG. 6 is a sectional view showing a part of the sixth embodiment of the present invention.

Now, the sixth embodiment of the present invention will be described with reference to FIG. 6. A substrate 9 made of sapphire is prepared, and a semiconductor layer 10 made of a thin-film single crystal of Si is formed on the substrate 9. Subsequent fabricating steps are similar to the steps of Embodiment 1. FIG. 6 is a sectional view which shows a part of the superconducting transistor of the present invention thus fabricated by the use of the semiconductor layer 10 of the thin film. The material of the semiconductor layer 10 should desirably be a single crystal, but the objects of the present invention can of course be accomplished even with a polycrystal or amorphous material. When signal light 11 is transmitted through the sapphire substrate 9 from the rear side of the superconducting transistor so as to enter the semiconductor layer 10, the carrier concentration of the channel portion 5 in the semiconductor layer 10 changes. Therefore, when an appropriate voltage is applied to the control electrode 3 in advance, the magnitude of the maximum superconducting current across the two superconducting electrodes 6 can be changed in accordance with variation in the intensity or wavelength of the signal light 11. Accordingly, the superconducting transistor operates as a photodetector. In the present embodiment, the semiconductor layer 10 is continuously formed on the substrate 9. However, even when insular semiconductor regions are fabricated and used, superconducting transistors can be readily isolated, and hence, the embodiment is suited to the production of an integrated circuit. Further, the signal light 11 is caused to enter the superconducting transistor by the use of a waveguide such as optical fiber. In the present embodiment, the superconducting transistor can detect the variations of both the intensity and wavelength of the signal light 11. Moreover, the superconducting transistor can detect the polarization of light when combined with an analyzer. The material of the substrate 9 is not restricted to sapphire, but any material of little optical attenuation meets the purpose. In addition, the material of the semiconductor layer 10 is not restricted to Si, but any of materials such as Ge, GaAs, InAs, InSb, InP, GaP and GdS can be employed.

As stated above, the size of the control electrode 3 can be designed without being limited by the opposition distance of the superconducting electrodes 6, and the superconducting wavefunction can be readily extracted underneath the control electrode 3 owing to the high impurity concentration layers 4, whereby an improved gain and a heightened switching speed are permitted.

Embodiment 7

Figure 7:
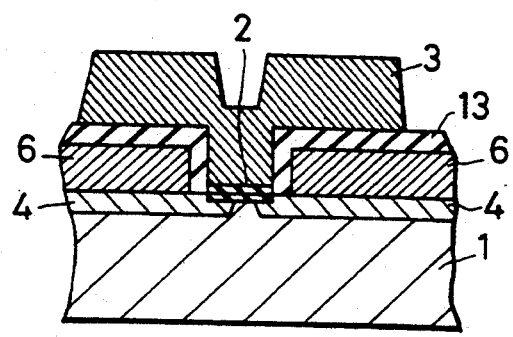
FIG. 7 is a sectional view showing a part of the seventh embodiment of the present invention.

FIG. 7 is a sectional structural view of a superconducting device according to the seventh embodiment of the present invention.

Figure 8A:
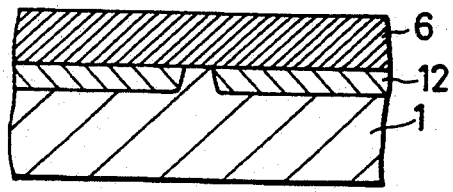
FIGS. 8A thru 8D are sectional views showing a method of manufacturing the superconducting device in FIG. 7.
Figure 8B:
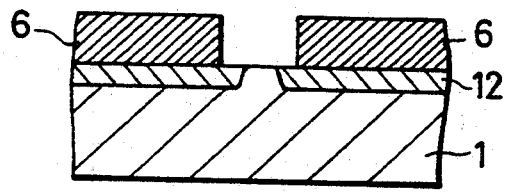
Figure 8C:
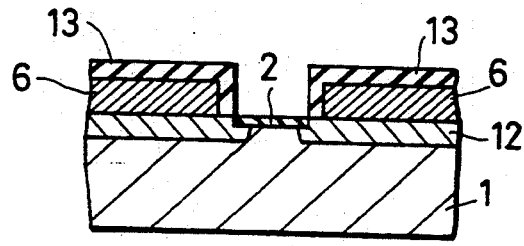
Figure 8D:
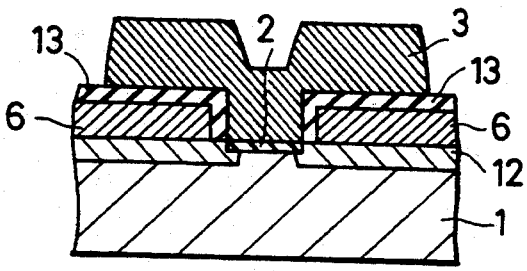

A pair of superconducting electrodes 6 to serve as source and drain electrodes are formed in contact with a semiconductor substrate 1 which functions as a channel. A control electrode 3 is so provided that a self-oxidation film 2 of the semiconductor substrate 1 to serve as a gate insulator film is interposed between this control electrode and the semiconductor substrate 1, while the self-oxidation films 13 of the superconducting electrodes 6 are interposed between it and the superconducting electrodes 6. Now, an example of a method of manufacturing the present embodiment will be described with reference to FIGS. 8A–8D. As shown in FIG. 8A, boron at a concentration of $10^{18}$–$10^{20}$ cm$^{-3}$ is introduced into selected parts of a semiconductor substrate 1 of Si so as to form impurity diffusion layers 12. Thereafter, an Nb thin film 6 is formed on the front surface of the substrate 1 by d.c. magnetron sputter deposition. Subsequently, as shown in FIG. 8B, the Nb thin film 6 is separated into two superconducting electrodes 6 (source and drain electrodes) by plasma etching with $CF_4$ gas and using as a mask a resist patterned with electron-beam lithography. Desirably, the distance between the superconducting electrodes 6 is selected within a range of 0.1–0.5 $\mu$m. Next, plasma oxidation employing oxygen gas is carried out for 30 minutes under the conditions of an oxygen pressure of 40 mTorr and an r.f. voltage of 400 $V_{p-p}$ (peak-to-peak value). As a result, a gate insulator layer 2 made of the self-oxidation film $SiO_2$ of Si and having a thickness of 20–80 nm and inter-layer insulator films 13 made of the self-oxidation film $Nb_2O_5$ of Nb and having a thickness of 200 nm are formed as shown in FIG. 8C. Incidentally, the gate insulator layer 2 and the inter-layer insulator layer 13 lie in contact with each other. Subsequently, while the resultant structure is held in vacuum without being exposed to the atmospheric air, Al is deposited thereon to a thickness of 400 nm by evaporation, and using a photoresist as a mask, it is processed into a desired shape so as to form a control electrode 3. Then, a device shown in FIG. 8D is fabricated. Owing to the above method, the superconducting device of the seventh embodiment can be produced. When this superconducting device was cooled to the liquid helium temperature (4.2° K.) and operated, a high gain was exhibited owing to a reduced capacitance based on the thin gate insulator layer. Moreover, as regards the fabricating process, the inter-layer insulator layers and the gate insulator layer can be simultaneously formed, so that the number of fabricating steps decreases, and the positioning is dispensed with. Further, since the self-oxidation films are utilized, the adhesion between the insulator layers and the corresponding electrodes is favorable, and the short-circuiting between the electrodes is not apprehended. It has accordingly been possible to realize a device of high stability, available percentage and reliability.

Embodiment 8

Figure 9:
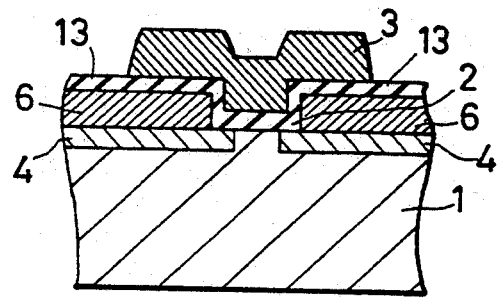
FIG. 9 is a sectional view showing a part of the eighth embodiment of the present invention.

FIG. 9 is a sectional structural view of a superconducting device according to the eighth embodiment of the present invention. A pair of superconducting electrodes 6 to serve as source and drain electrodes are formed in contact with a semiconductor substrate 1 to serve as a channel layer, and a control electrode 3 is disposed through insulator layers 2 and 13 which are the self-oxidation films of the superconducting electrodes. This device can be fabricated by a method to be described below: Boron at a concentration of $10^{18}$–$10^{20}$ cm$^{-3}$ is introduced into selected parts of a semiconductor substrate 1 of Si as shown in FIG. 8A, thereby to form impurity diffusion layers 4. Thereafter, an Nb thin film 6 is formed on the substrate 1 by d.c. magnetron sputter deposition. Subsequently, using as a mask a photoresist pattern prepared by electron-beam lithography, a part of the Nb thin film 6 is subjected to plasma etching with CF$_4$ gas and is thus thinned. The width of the part to be etched is 0.1 μm–0.5 μm, and the thickness of the Nb 6 left behind by the etching should desirably be 50 nm or less. Next, plasma oxidation with oxygen gas is carried out for 30 minutes under the conditions of an oxygen pressure of 40 mTorr and an r.f. voltage of 400 $V_{p-p}$, whereby the etched part of the Nb thin film is completely oxided to form a gate insulator layer 2, and simultaneously, inter-layer insulator layers 13 are formed. Subsequently, Al is deposited 400 nm by evaporation, and it is etched into a control electrode of desired shape 3 by employing a photoresist as a mask. Then, the device shown in FIG. 9 is fabricated. With this device, the gate insulator film of desired thickness can be formed at a high thickness precision, and the short-circuiting of the control electrode with the superconducting electrode or with the semiconductor substrate can be prevented. Besides, since the oxidation step at one time suffices, the number of fabricating steps decreases, and a device of high reliability, safety and available percentage can be realized.

Even when the substrate 1 and the diffused layers 4 of the above superconducting devices are made of Si or Ge containing an impurity such as phosphorus or arsenic at a concentration of at least $10^{18}$ cm$^{-3}$ or GaAs, InAs or InSb containing an impurity such as Si, Zn or Ge at a concentration of at least $10^{17}$ cm$^{-3}$, similar effects can be attained. Even when the material of the superconducting electrodes 6 is Pb, an alloy principally containing Pb, an Nb compound, or the like, similar effects can be achieved.

Embodiment 9

Figure 12:
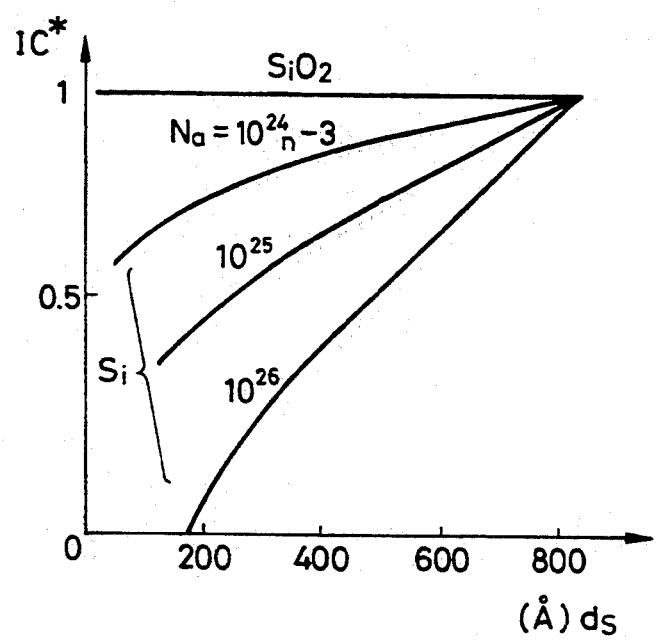
FIG. 12 is a graph for explaining the operating principle of the ninth embodiment.
Figure 13:
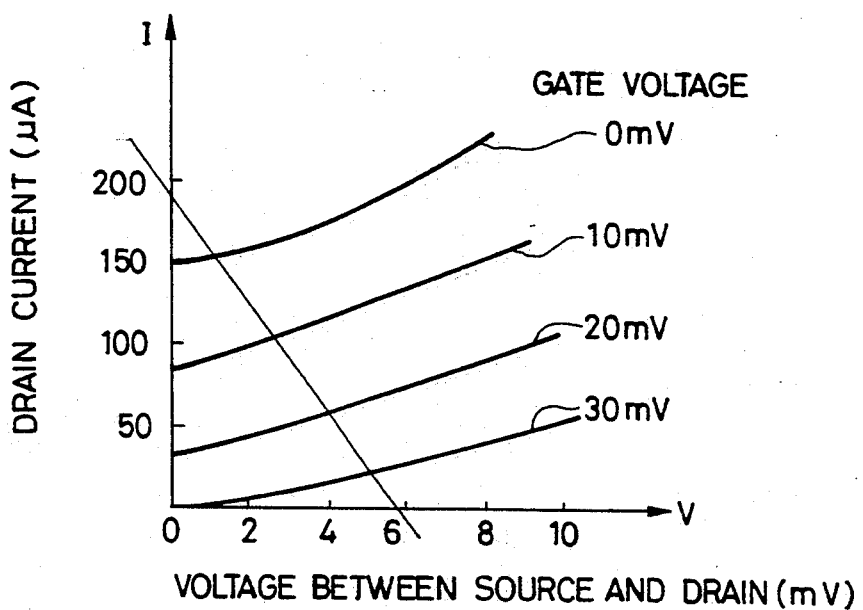
FIG. 13 is a graph showing the electrical characteristic of the ninth embodiment.

Now, the ninth embodiment of the present invention will be described with reference to the drawings. Both FIGS. 10 and 11 are sectional structural views of the ninth embodiment, FIG. 12 is a diagram showing the operating principle of this embodiment, and FIG. 13 is a diagram showing the electric characteristics thereof.

Figure 10:
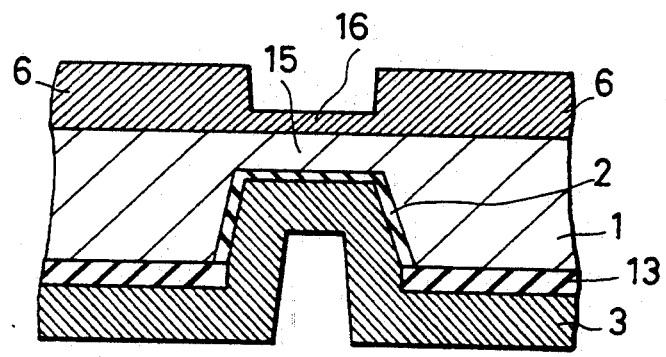
FIGS. 10 and 11 are sectional views each showing a part of the ninth embodiment of the present invention.

Shown in FIG. 10 is an example employing a channel layer 15 which is obtained in such a way that an Si substrate (100) at numeral 1 is anisotropically etched from the rear surface thereof. The Si substrate 1 has the etched surface doped with a p-type impurity at $1\times10^{19}$ cm$^{-3}$, and is subjected to thermal oxidation at 1000° C. for 20 minutes so as to form a gate oxide film 2 being about 20 nm thick. Thereafter, a gate electrode 3 made of an Nb thin film 200 nm thick is formed by d.c. sputtering deposition. Subsequently, an Nb thin film 6 is formed on the front surface of the Si substrate 1 by d.c. magnetron sputtering deposition, and a part 16 thereof is processed to a thickness of at most 10 nm by reactive plasma etching with CF$_4$ gas.

Figure 11:
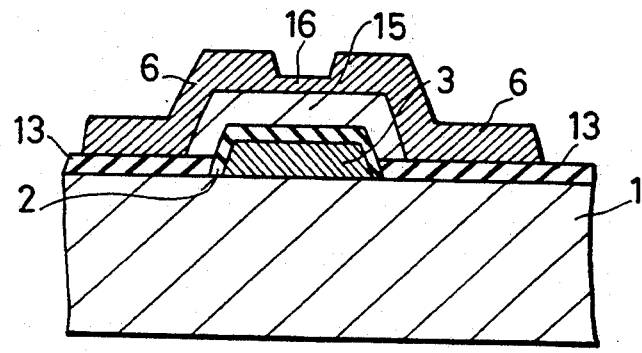

In an example of FIG. 11, on the (100) plane of an Si substrate 1 having an impurity concentration of at most $10^{14}$ cm$^{-3}$, polycrystalline Si is deposited 200 nm by CVD. Thereafter, the polycrystalline Si except a gate electrode 3 is oxidized by LOCOS, and a gate oxide film 2 is simultaneously formed. The gate electrode 3 is implanted with boron under the conditions of an acceleration voltage of 50 kV and a dose of $5\times10^{14}$ cm$^{-2}$. Thereafter, a channel layer 15 made of Si having a thickness of 100 nm is formed by molecular-beam epitaxy or vapor deposition. Subsequently, Nb 6 is deposited about 200 nm by d.c. magnetron sputter deposition, and a part 16 thereof is thinned to or below 10 nm by ion etching with CF$_4$ gas.

In the above way, the superconducting transistor shown in FIG. 11 can be fabricated. As illustrated in FIG. 12, when the thickness of a superconductor decreases to become less than the coherence length thereof, a superconducting critical current $I_c^*$ to flow through the thin film decreases with the increase of an impurity concentration Na in a contacting semiconductor. In a case where the superconductor lies in contact with an insulator such as SiO$_2$, a fixed current value $I_c$ is assumed irrespective of the thickness of the superconductor. This is based on the superconducting proximity effect. By exploiting this property, the critical current $I_c^*$ is decreased when the superconducting electrode is partially or wholly made thinner than the coherence length and a voltage is applied to the gate electrode to increase a carrier concentration.

In this manner, the magnitude of the superconducting current to flow through the film can be controlled by the gate voltage. The superconducting transistors stated above do not require the microfabrication technique of separating the source and drain electrodes at a very short distance, and are well suited to higher densities of integration. Moreover, since the magnitude of the superconducting current is controlled, switching devices of high operating speed, high gain and low power consumption can be realized.

In the present embodiment, Si is employed as the semiconductor. However, even when it is replaced with a material such as GaAs, InP, InAs or InSb, similar effects are attained. Besides, although Nb is employed as the superconductor, any of NbN, Nb$_3$Si, Mo compounds and Pb alloys may well be employed.

What is claimed is:

1. A superconducting device comprising:
    a semiconductor body, having a flat surface;
    a pair of superconducting electrodes which are formed in contact with said flat surface face of said semiconductor body, and which are spaced at a distance of 5 to 20 times a coherence length of a superconducting electron pair in said semiconductor body;
    a pair of impurity regions which are formed extending from said flat surface into said semiconductor body in a manner to lie in contact with said superconducting electrodes and to extend between said superconducting electrodes; and
    control electrode means to control current flowing between said superconducting electrodes, said means being formed on said semiconductor body so as to cover at least an area between said impurity regions and to be separated from said semiconductor body by an electric insulator film, said means serving to control a superconducting weak-coupling state between said superconducting electrodes, the control electrode means and the pair of superconducting electrodes, together with the pair of impurity regions, being provided such that, when a voltage is applied to the control electrode means, superconducting electron pairs can diffuse under the control electrode means so as to induce a superconducting coupling between the pair of superconducting electrodes, whereby superconducting current flows, an effective width of the control electrode means being smaller than a distance between the superconducting electrodes, the pair of impurity regions having a distance therebetween that is smaller than the effective width of the control electrodes means.

2. The superconducting device as defined in claim 1, further comprising an impurity layer under said control electrode means and between said impurity regions.

3. The superconducting device as defined in claim 1, wherein said impurity regions extend to under said control electrode means.

4. The superconducting device as defined in claim 1, wherein said semiconductor body is provided on a base plate, said base plate being made of a material that can transmit light therethrough, and means is provided for projecting light on a part of said semiconductor body under said control electrode means, through said base plate.

5. The superconducting device as defined in claim 1, wherein said control electrode means is formed on said superconducting electrodes and is separated therefrom by insulating thin films which are made of at least one member selected from the group consisting of an oxide and a nitride of said superconducting electrodes.

6. The superconducting device as defined in claim 5, wherein said insulating thin films lie in contact with said electric insulator film.

7. The superconducting device as defined in claim 6, wherein said electric insulator film is made of at least one member selected from the group consisting of an oxide and a nitride of said superconducting electrodes.

8. The superconducting device as defined in claim 5, wherein said insulating thin films are each thicker than said electric insulator film.

9. A superconducting device comprising two superconducting electrodes which are formed in contact with a semiconductor and which are spaced from each other, so as to provide a spacing therebetween, said semiconductor having a flat surface, two impurity regions which are formed extending from the flat surface of said semiconductor, into the semiconductor, each impurity region being in contact with a respective superconducting electrode and extending from said respective superconducting electrode, toward the other of the two superconducting electrodes, the two impurity regions leaving a gap therebetween, a channel which is made of the semiconductor and which corresponds to the gap between said impurity regions, and a control electrode which is provided so as to cover at least said channel, said control electrode and two superconducting electrodes, together with the two impurity regions, being provided such that, when voltage is applied to the control electrode, superconducting electron pairs can diffuse under the control electrode so as to induce a superconducting coupling between the two superconducting electrodes, whereby superconducting current flows, an effective width of the control electrode being smaller than said spacing between the two superconducting electrodes, said gap between the two impurity regions being smaller than the effective width of the control electrode.

10. The superconducting device as defined in claim 9, wherein said control electrode exists only over said semiconductor and does not exist over said superconducting electrodes.

11. The superconducting device as defined in claim 9, wherein said control electrode is narrower than said spacing between said superconducting electrodes.

12. The superconducting device as defined in claim 9, wherein a material of which said superconducting electrodes are made is selected from the group consisting of Pb, Pb alloys, Nb, Nb compounds and Mo compounds.

13. The superconducting device as defined in claim 9, wherein a material of said semiconductor is selected from the group consisting of Si, Ge, GaAs, InAs, InP, InSb and GaP.

14. A superconducting device comprising at least:
a semiconductor body, having a flat surface,
a pair of superconducting electrodes which lie in contact with said semiconductor body, spaced from each other,
impurity regions, extending from the flat surface of said semiconductor body, and into the semiconductor body, which lie in contact with respectively corresponding ones of said pair of superconducting electrodes, so as to provide an effective channel length for the device which is less than the spacing between the superconducting electrodes, and
means to control current flowing between said pair of superconducting electrodes, said means being formed on said semiconductor body,
the current control means having an effective width which is smaller than a distance between said superconducting electrodes, said current control means and pair of superconducting electrodes, together with the impurity regions, being provided such that, when a voltage is applied to the current control means, superconducting electron pairs can diffuse under the current control means so as to induce a superconducting coupling between the pair of superconducting electrodes, whereby superconducting current flows, a distance between impurity regions respectively in contact with corresponding ones of said pair of superconducting electrodes being smaller than the effective width of the current control means.

15. The superconducting device as defined in claim 14, wherein said current control means comprises an electric insulator film which is formed on said semiconductor body, and an electric conductor layer which lies on said film.

16. The superconducting device as defined in claim 1, wherein said impurity regions have a depth, from said flat surface in contact with said superconducting electrodes, that is at least 0.5 of the superconducting coherence length in the semiconductor body.

17. The superconducting device as defined in claim 1, wherein the impurity regions each have an impurity concentration of at least $1 \times 10^{18}$ cm$^{-3}$.

18. The superconducting device as defined in claim 1, wherein the semiconductor body is made of a material selected from the group consisting of GaAs, Si, Ge, InAs, InP, InSb and GaSb.

19. The superconducting device as defined in claim 4, wherein said semiconductor body is a thin-film single crystal of semiconductor material, provided on the base plate.

20. The superconducting device as defined in claim 1, wherein the pair of superconducting electrodes are made of a material selected from the group consisting of Nb and compounds thereof, Mo compounds and Pb and alloys thereof.

21. The superconducting device as defined in claim 20, wherein the pair of superconducting electrodes are made of a material selected from the group consisting of Nb, NbN, Nb$_3$Sn, Nb$_3$Si, Pb and MoN.

22. The superconducting device as defined in claim 9, wherein the two superconducting electrodes are spaced from each other a distance of 5 to 20 times a coherence length of a superconducting electron pair in said semiconductor.

23. The superconducting device as defined in claim 14, wherein the pair of superconducting electrodes are spaced from each other a distance of 5 to 20 times a coherence length of a superconducting electron pair in said semiconductor body.

24. The superconducting device as defined in claim 1, wherein the pair of impurity regions are provided so as to achieve a superconducting device having high gain and high operating speed as compared to the same device without said pair of impurity regions.

25. The superconducting device as defined in claim 1, wherein a portion of the control electrode means providing the effective width of the control electrode means overlaps each of the pair of impurity regions.

26. The superconducting device as defined in claim 1, wherein a portion of the control electrode means providing the effective width of the control electrode means overlaps at least one of the pair of impurity regions.

27. The superconducting device as defined in claim 26, wherein the two impurity regions are high impurity concentration impurity regions.

28. The superconducting device as defined in claim 27, wherein the high impurity concentration impurity regions have impurity concentrations of at least $1 \times 10^{18}$ cm$^{-3}$.

29. The superconducting device as defined in claim 9, wherein a portion of the control electrode providing the effective width of the control electrode overlaps each of the two impurity regions.

30. The superconducting device as defined in claim 9, wherein a portion of the control electrode providing the effective width of the control electrode overlaps at least one of the two impurity regions.

31. The superconducting device as defined in claim 30, wherein the two impurity regions are high impurity concentration impurity regions.

32. The superconducting device as defined in claim 31, wherein the high impurity concentration impurity regions have impurity concentrations of at least $1 \times 10^{18}$ cm$^{-3}$.

33. The superconducting device as defined in claim 14, wherein a portion of the current control means providing the effective width overlaps each of the impurity regions in contact with respectively corresponding ones of said pair of superconducting electrodes.

34. The superconducting device as defined in claim 14, wherein a portion of the current control means providing the effective width overlaps at least one of the impurity regions in contact with respectively corresponding ones of said pair of superconducting electrodes.

35. The superconducting device as defined in claim 34, wherein the impurity region overlapped by said portion of the current control means is a high impurity concentration impurity region.

36. The superconducting device as defined in claim 35, wherein the high impurity concentration impurity region has an impurity concentration of at least $1 \times 10^{18}$ cm$^{-3}$.

37. The superconducting device as defined in claim 26, wherein said effective width of said control electrode means does not overlap either of said superconducting electrodes.

38. The superconducting device as defined in claim 1, wherein said effective width of said control electrode means does not overlap either of said superconducting electrodes.

39. The superconducting device as defined in claim 26, wherein said control electrode means does not overlap either of said superconducting electrodes.

40. The superconducting device as defined in claim 1, wherein said control electrode means does not overlap either of said superconducting electrodes.

41. The superconducting device as defined in claim 9, wherein said effective width of said control electrode does not overlap either of said superconducting electrodes.

42. The superconducting device as defined in claim 9, wherein said control electrode does not overlap either of said superconducting electrodes.

43. The superconducting device as defined in claim 14, wherein said effective width of said current control means does not overlap either of said superconducting electrodes.

44. The superconducting device as defined in claim 14, wherein said current control means does not overlap either of said superconducting electrodes.

45. A superconducting device comprising:
a semiconductor body having a flat surface;
a pair of superconducting electrodes which are formed in contact with the flat surface of said semiconductor body;
a pair of impurity regions made of non-superconducting material, which are formed within said semiconductor body in a manner to lie in contact with said superconducting electrodes; and
a control electrode means to control current flowing between said superconducting electrodes, said means being formed on said semiconductor body and being separated from said semiconductor body by an electric insulator film;
wherein the control electrode means is formed on the semiconductor body so as to cover at least an area between the impurity regions, an effective width of the control electrode means being smaller than a distance between the superconducting electrodes, the pair of impurity regions having a distance therebetween that is smaller than the effective width of the control electrode means.

46. A superconducting device comprising:
a semiconductor body having a flat surface;
a pair of superconducting electrodes which are formed in contact with the flat surface of said semiconductor body;
a pair of impurity regions made of non-superconducting material, which are formed within said semiconductor body in a manner to lie in contact with said superconducting electrodes; and
a control electrode means to control current flowing between said superconducting electrodes, said means being formed on said semiconductor body and being separated from said semiconductor body by an electric insulator film;

wherein the pair of impurity regions has a gap therebetween, a channel being made of the semiconductor and corresponding to the gap between the impurity regions, an effective width of the control electrode means being smaller than a distance between the superconducting electrodes, the pair of impurity regions having a distance therebetween that is smaller than the effective width of the control electrode means.

47. A superconducting device comprising:

a semiconductor body having a flat surface;

a pair of superconducting electrodes which are formed in contact with the flat surface of said semiconductor body;

a pair of impurity regions made of non-superconducting material, which are formed within said semiconductor body in a manner to lie in contact with said superconducting electrodes; and a control electrode means formed on the semiconductor body;

wherein an effective width of the control electrode means is smaller than a distance between the superconducting electrodes, the pair of impurity regions having a distance therebetween that is smaller than the effective width of the control electrode means.

* * * * *